US012696624B2

(12) United States Patent
Yuan et al.

(10) Patent No.: US 12,696,624 B2
(45) Date of Patent: Jul. 28, 2026

(54) DISPLAY PANEL, DISPLAY DEVICE AND METHOD FOR PREPARING DISPLAY PANEL

(71) Applicants: HEFEI BOE JOINT TECHNOLOGY CO., LTD., Hefei (CN); BOE TECHNOLOGY GROUP CO., LTD., Beijing (CN)

(72) Inventors: Zhidong Yuan, Beijing (CN); Pan Xu, Beijing (CN); Huifeng Wang, Beijing (CN); Can Yuan, Beijing (CN); Zhongyuan Wu, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 508 days.

(21) Appl. No.: 18/247,230

(22) PCT Filed: Apr. 29, 2022

(86) PCT No.: PCT/CN2022/090207
§ 371 (c)(1),
(2) Date: Mar. 29, 2023

(87) PCT Pub. No.: WO2023/206340
PCT Pub. Date: Nov. 2, 2023

(65) Prior Publication Data
US 2024/0365595 A1      Oct. 31, 2024

(51) Int. Cl.
*H10K 59/122*        (2023.01)
*H10K 59/12*         (2023.01)
*H10K 59/88*         (2023.01)

(52) U.S. Cl.
CPC ....... *H10K 59/122* (2023.02); *H10K 59/1201* (2023.02); *H10K 59/88* (2023.02)

(58) Field of Classification Search
CPC ... H10K 59/122; H10K 59/1201; H10K 59/88
(Continued)

(56) References Cited

U.S. PATENT DOCUMENTS

2016/0178940 A1*   6/2016  Yuan ................. G02F 1/133514
                                                     359/893
2018/0026225 A1*   1/2018  Kwon .................. H10K 59/873
                                                     257/40
(Continued)

FOREIGN PATENT DOCUMENTS

CN        106873224 A      6/2017
CN        107808896 A      3/2018
(Continued)

OTHER PUBLICATIONS

Machine English Translation of CN 106873224 (Year: 2015).*

*Primary Examiner* — Dzung Tran
(74) *Attorney, Agent, or Firm* — Armstrong Teasdale LLP

(57) ABSTRACT

Embodiments of the present disclosure provide a display panel, a display device, and a method for preparing a display panel. The display panel has a display area and a peripheral area, the display panel including a pixel defining layer including a plurality of first pixel defining blocks in the display area parallelly arranged in a first direction, and adjacent first pixel defining blocks having different columns of pixel defining openings, and at least one second pixel defining block in the peripheral area as an extension of at least one first pixel defining block in a second direction to the peripheral area, each second pixel defining block including a plurality of columns of pixel defining openings, a column number which is greater than or equal to the difference in the column numbers of pixel defining openings of two adjacent first pixel defining blocks.

15 Claims, 7 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2019/0326376 | A1* | 10/2019 | Huo ..................... | H10K 59/352 |
| 2022/0080697 | A1* | 3/2022 | Cao .......................... | B32B 3/02 |

FOREIGN PATENT DOCUMENTS

| | | | |
|---|---|---|---|
| CN | 108417737 | A | 8/2018 |
| CN | 108508657 | A | 9/2018 |
| CN | 108766985 | A | 11/2018 |
| CN | 108919548 | A | 11/2018 |
| CN | 109389909 | A | 2/2019 |
| CN | 109407381 | A | 3/2019 |
| CN | 109713162 | A | 5/2019 |
| CN | 109801583 | A | 5/2019 |
| CN | 110687726 | A | 1/2020 |
| CN | 110729335 | A | 1/2020 |
| CN | 111312779 | A | 6/2020 |
| WO | 2021225971 | A1 | 11/2021 |

* cited by examiner

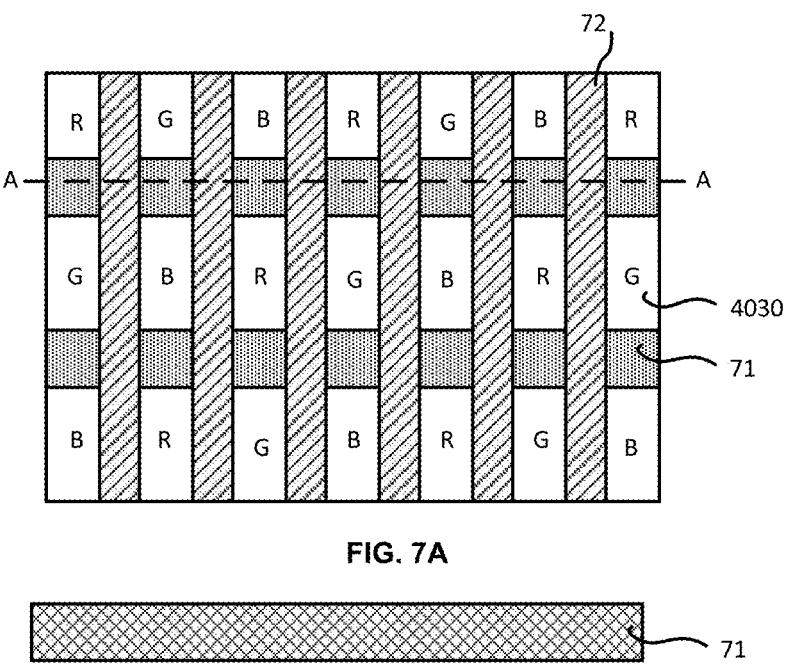
FIG. 7A
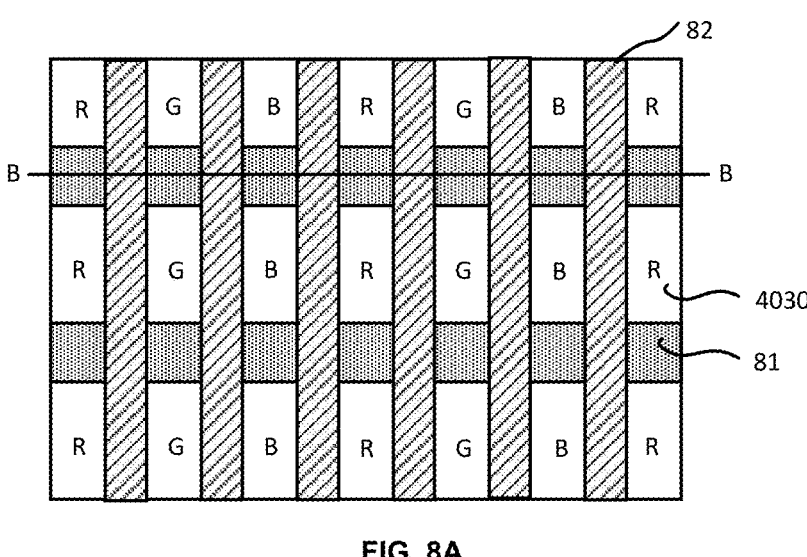
FIG. 7B
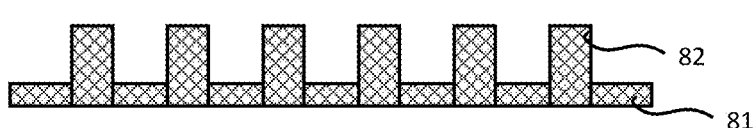
FIG. 8A
FIG. 8B

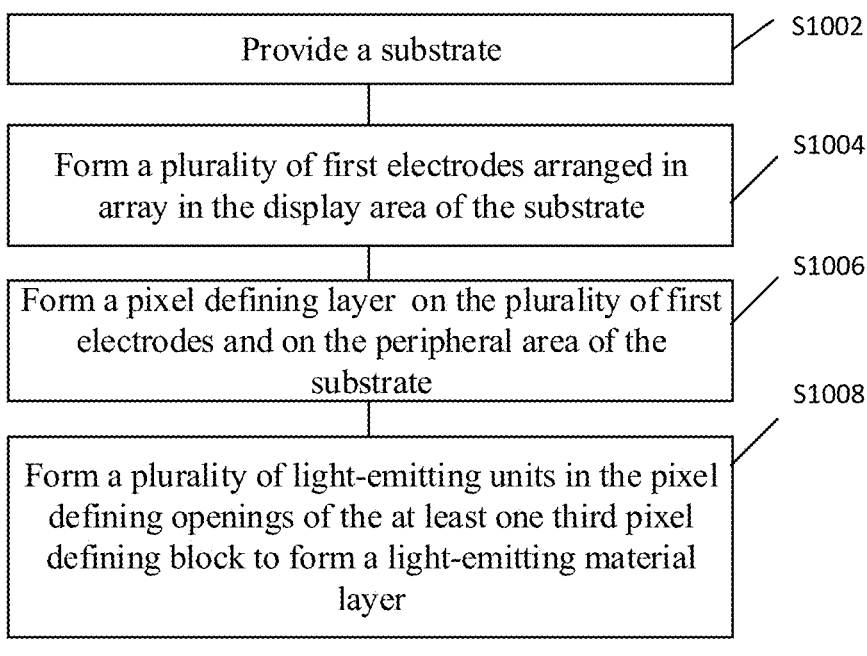
FIG. 11
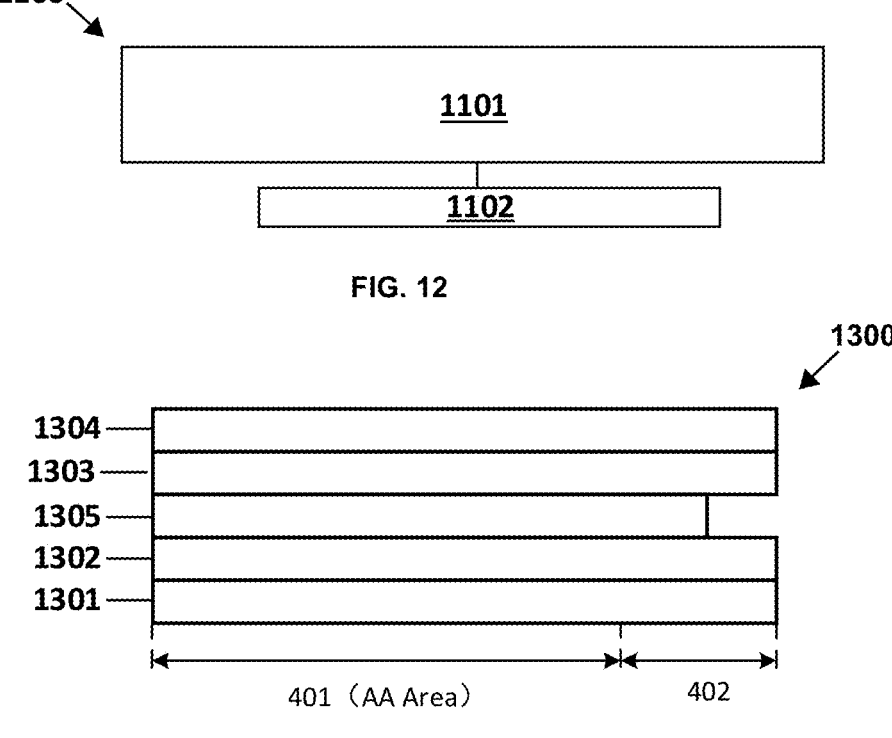
FIG. 12
FIG. 13

DISPLAY PANEL, DISPLAY DEVICE AND METHOD FOR PREPARING DISPLAY PANEL

CROSS REFERENCE TO RELATED APPLICATIONS

This patent application is a National Stage Entry of PCT/CN2022/090207 filed on Apr. 29, 2022, the disclosure of which is incorporated by reference herein in its entirety as part of the present application.

BACKGROUND

The present disclosure relates to the field of display technology and, in particular, to a display panel, a display device and a method for preparing a display panel.

An Organic Light-Emitting Diode (OLED) display device, also known as an organic electroluminescent display device, is a display device different from the traditional liquid crystal display (LCD). Such a display technology has the advantages of simple structure, self-luminous, high contrast ratio, thin thickness, wide viewing angle, fast response speed, continuously adjustable light-emitting color, and being capable of being used for flexible panels, etc. Therefore, it has become one of the important development directions of the new generation of display devices, and has received more and more attention.

With the continuous development of the display industry, the traditional rectangular display panel is far from meeting the needs of market diversity, and the design and production of special-shaped screen are imminent.

BRIEF DESCRIPTION

Embodiments of the present disclosure provide a display panel, a display device, and a method for preparing a display panel.

A first aspect of the present disclosure provides a display panel having a display area and a peripheral area at least partially encircling the display area, the display panel including a pixel defining layer. The pixel defining layer includes a plurality of first pixel defining blocks disposed in the display area and parallelly arranged in a first direction, each first pixel defining block extending in a second direction perpendicular to the first direction and including a plurality of columns of pixel defining openings with a column direction in the first direction, and adjacent first pixel defining blocks having different columns of pixel defining openings, and at least one second pixel defining block disposed in the peripheral area and serving as an extension of at least one of the plurality of first pixel defining blocks in the second direction to the peripheral area, each second pixel defining block including a plurality of columns of pixel defining openings, and having a column number of pixel defining openings greater than or equal to the difference in the column numbers of pixel defining openings of two adjacent first pixel defining blocks.

In one or more embodiments of the present disclosure, the extension of the at least one of the plurality of first pixel defining blocks by the at least one second pixel defining block allows the pixel defining layer to be reclassified to include at least one third pixel defining block, wherein each third pixel defining block is assigned at least two adjacent first pixel defining blocks and at least portions of the second pixel defining blocks as the extensions of the at least two adjacent first pixel defining blocks, and each third pixel defining block has a column number of pixel defining openings equal to a sum of the column number of pixel defining openings of the one of the at least two adjacent first pixel defining blocks having the least columns of pixel defining openings and the column number of pixel defining openings of the second pixel defining block.

In one or more embodiments of the present disclosure, the at least one second pixel defining block includes a plurality of second pixel defining blocks, one of the plurality of second pixel defining blocks is connected to one of the plurality of first pixel defining blocks, and each of the plurality of second pixel defining blocks has a row number of pixel defining openings equal to a row number of pixel defining openings of the first pixel defining block connected to the second pixel defining block, and wherein a row direction is oriented in the same direction as the second direction.

In one or more embodiments of the present disclosure, the column number of pixel defining openings $N_2$ of each second pixel defining block satisfies: $N_2 \geq K^* \delta_N$, where K is a positive integer and $\delta_N$ is a difference in the column numbers of the pixel defining openings of the two adjacent first pixel defining blocks.

In one or more embodiments of the present disclosure, the peripheral area includes a package area and a dummy area disposed between the display area and the package area, and wherein the plurality of second pixel defining blocks are disposed in the dummy area.

In one or more embodiments of the present disclosure, the column number of pixel defining openings $N_2$ of each second pixel defining block satisfies: $K^* \delta_N \leq N_2 \leq D/P$, where D is a distance in the second direction between two boundaries of the dummy area and P is a pitch of the pixel defining openings of the second pixel defining block.

In one or more embodiments of the present disclosure, the number $N_p$ of the third pixel defining blocks is represented by the following equation: $N_p = N_f/([N_2/\delta_N]+1)$, where the symbol [ ] denotes rounding down $N_2/\delta_N$, $N_f$ denotes the number of the first pixel defining blocks, and $N_2$ denotes the column number of pixel defining openings of each second pixel defining block.

In one or more embodiments of the present disclosure, the display area and the peripheral area both have a non-rectangular shape. In one or more embodiments of the present disclosure, the display area and the peripheral area have an axisymmetric shape about the first direction.

In one or more embodiments of the present disclosure, each of the second pixel defining blocks includes a first portion and a second portion as extensions of the respective first pixel defining block to the peripheral area on both sides of the respective first pixel defining block, respectively, and the column number of second pixel defining openings of each second pixel defining block is equal to a sum of a column number of pixel defining openings of the first portion and a column number of pixel defining openings of the second portion.

In one or more embodiments of the present disclosure, the display panel further includes a layer of light-emitting material having a plurality of light-emitting units. In the case where the plurality of first pixel defining blocks are all assigned to the at least one third pixel defining block, the plurality of light-emitting units are respectively formed in a plurality of pixel defining openings of the at least one third pixel defining block. In the case where there is a remaining first pixel defining block not assigned to the at least one third pixel defining block, the remaining first pixel defining block is combined with at least a portion of the second pixel defining block as the extension of the remaining first pixel defining block to form a fourth pixel defining block, some of the plurality of light-emitting units being formed in the plurality of pixel defining openings of the at least one third pixel defining block, and some other of the plurality of light-emitting units are formed in a plurality of pixel defining openings of the fourth pixel defining block.

In one or more embodiments of the present disclosure, in the case where there is a remaining pixel defining opening of the at least one second pixel defining block not assigned to the respective third pixel defining block, no light-emitting unit is provided in the remaining pixel defining opening of the at least one second pixel defining block.

In one or more embodiments of the present disclosure, the display panel further includes an organic common-pass layer configured to enable the layer of light-emitting material to emit light, the organic common-pass layer being formed in the pixel defining openings of the first pixel defining block and the pixel defining openings of the second pixel defining block.

In one or more embodiments of the present disclosure, the display panel further includes a substrate, and a plurality of first electrodes disposed on a side of the pixel defining layer close to the substrate, wherein orthographic projections of the plurality of first electrodes on the substrate at least partially overlap orthographic projections of the plurality of pixel defining openings of the first pixel defining blocks on the substrate, respectively, and the orthographic projections of the plurality of first electrodes on the substrate are separated from orthographic projections of the plurality of pixel-defining openings of the plurality of second pixel-defining blocks on the substrate.

In one or more embodiments of the present disclosure, each first pixel defining block further includes a plurality of first vertical pixel defining strips extending in the first direction and spaced apart in the second direction, and a plurality of first horizontal pixel defining strips extending in the second direction and spaced apart in the first direction, the pixel defining openings of the plurality of first pixel defining blocks being defined by the plurality of first vertical pixel defining strips and the plurality of first horizontal pixel defining strips, and each of the plurality of first vertical pixel defining strips having a thickness in a third direction perpendicular to the first direction and the second direction greater than a thickness of each of the plurality of first horizontal pixel defining strips in the third direction.

In one or more embodiments of the present disclosure, each second pixel defining block further includes a plurality of second vertical pixel defining strips extending in the first direction and spaced apart in the second direction, and a plurality of second horizontal pixel defining strips extending in the second direction and spaced apart in the first direction, the pixel defining openings of the plurality of second pixel defining blocks being defined by the plurality of second vertical pixel defining strips and the plurality of second horizontal pixel defining strips, and each of the plurality of second vertical pixel defining strips having a thickness in a third direction perpendicular to the first direction and the second direction greater than the thickness of each of the plurality of second horizontal pixel defining strips in the third direction.

In one or more embodiments of the present disclosure, each second pixel defining block further includes a plurality of second vertical pixel defining strips extending in the first direction and spaced apart in the second direction, the pixel defining openings of each second pixel defining block in the same column being connected to form a pixel defining channel defined by adjacent second vertical pixel defining strips.

In one or more embodiments of the present disclosure, the peripheral area includes an initialization signal line including a body portion extending around a boundary between the peripheral area and the display area, and a plurality of protrusion portions protruding from the body portion toward the display area in a direction parallel to the second direction, an orthographic projection of at least one of the plurality of protrusion portions on the substrate being between the orthographic projections of the adjacent two rows of pixel defining openings of the second pixel defining block on the substrate, so that the individual protrusion portion provides signals for adjacent two rows of pixels defined by the adjacent two rows of pixel defining openings of the first pixel defining block extended by the second pixel defining block.

In another aspect of the present disclosure provides a method for preparing a display panel. The display panel has a display area and a peripheral area at least partially encircling the display area. The method includes providing a substrate, and forming a pixel defining layer on the substrate, the pixel defining layer including a plurality of first pixel defining blocks disposed in the display area and parallelly arranged in a first direction, each first pixel defining block extending in a second direction perpendicular to the first direction and including a plurality of columns of pixel defining openings with a column direction in the first direction, and adjacent first pixel defining blocks having different columns of pixel defining openings, and at least one second pixel defining block in the peripheral area as an extension of at least one of the plurality of first pixel defining blocks in the second direction to the peripheral area, each second pixel defining block including a plurality of columns of pixel defining openings, and having a column number of pixel defining openings greater than or equal to the difference in the column numbers of pixel defining openings of two adjacent first pixel defining blocks.

In one or more embodiments of the method for preparing a display panel of the present disclosure, the extension of the at least one of the plurality of first pixel defining blocks by the at least one second pixel defining block allows the pixel defining layer to be reclassified to include at least one third pixel defining block, wherein each third pixel defining block is assigned at least two adjacent first pixel defining blocks and at least portions of the second pixel defining blocks as the extensions of the at least two adjacent first pixel defining blocks, and each third pixel defining block has a column number of pixel defining openings equal to a sum of the column number of pixel defining openings of the first pixel defining block having the least columns of pixel defining openings of the at least two adjacent first pixel defining blocks and the column number of pixel defining openings of the second pixel defining block.

In one or more embodiments of the method for preparing a display panel of the present disclosure, prior to forming the pixel defining layer, the method further includes forming a plurality of first electrodes in the display area of the substrate, forming the pixel defining layer including forming the pixel defining layer on the plurality of first electrodes and in the peripheral area such that orthographic projections of the plurality of first electrodes on the substrate at least partially overlaps orthographic projections of the plurality of first pixel defining openings of the plurality of first pixel defining blocks on the substrate, respectively, and the orthographic projections of the plurality of first electrodes on the substrate are separated from orthographic projections of the plurality of pixel defining openings of the plurality of second pixel defining blocks on the substrate. After forming the pixel defining layer, the method further including forming a plurality of light-emitting units in the pixel defining openings of the at least one third pixel defining block to form a layer of light-emitting material, wherein, in the case where there is a remaining pixel defining opening of the at least one second pixel defining block not assigned to a respective third pixel defining block, no light-emitting units are formed in the remaining pixel defining opening of the at least one second pixel defining block.

In one or more embodiments of the method for preparing a display panel of the present disclosure, the plurality of light-emitting units are formed in the pixel defining openings of the at least one third pixel defining block by inkjet printing technology, wherein for a third pixel defining block, the plurality of light-emitting units are formed in the pixel defining openings of the third pixel defining block with a single print configuration parameter, and for different third pixel defining blocks, the plurality of light-emitting units are formed in the pixel defining openings of the third pixel defining block with different print configuration parameters.

In one or more embodiments of the method for preparing a display panel of the present disclosure, the print configuration parameters includes a row number and a column number of light-emitting units to be printed in a single print.

In one or more embodiments of the method for preparing a display panel of the present disclosure, both the display area and the peripheral area have a non-rectangular shape, and wherein the display area and the peripheral area have an axisymmetric shape about the first direction.

In yet another aspect of the present disclosure, there is also provided a display device including at least one display panel according to one or more embodiments of the present disclosure.

Further aspects and areas of applicability will become apparent from the description provided herein. It should be understood that various aspects of this application may be implemented individually or in combination with one or more other aspects. It should also be understood that the description and specific examples herein are intended for purposes of illustration only and are not intended to limit the scope of the present application.

BRIEF DESCRIPTION OF THE DRAWINGS

The drawings described herein are for illustrative purposes only of selected embodiments and not all possible implementations, and are not intended to limit the scope of the present application.

FIG. 7A schematically illustrates a plan view of a pixel bank pattern of the pixel defining layer and a pixel distribution formed by the pixel bank pattern;

FIG. 7B schematically illustrates a cross-sectional view along line AA in FIG. 7A;

FIG. 8A schematically illustrates a plan view of a line bank pattern of the pixel defining layer and a pixel distribution formed by the line bank pattern;

FIG. 8B schematically illustrates a cross-sectional view along line BB in FIG. 8A;

FIG. 11 schematically illustrates a flowchart of a process for preparing a display panel in accordance with one or more embodiments of the present disclosure;

FIG. 12 schematically illustrates a display device in accordance with one or more embodiments of the present disclosure;

FIG. 13 schematically illustrates a cross-sectional view of an organic common-pass layer and a layer of light emitting material.

Corresponding reference numerals indicate corresponding parts or features throughout the several views of the drawings.

DETAILED DESCRIPTION

Figure 1:
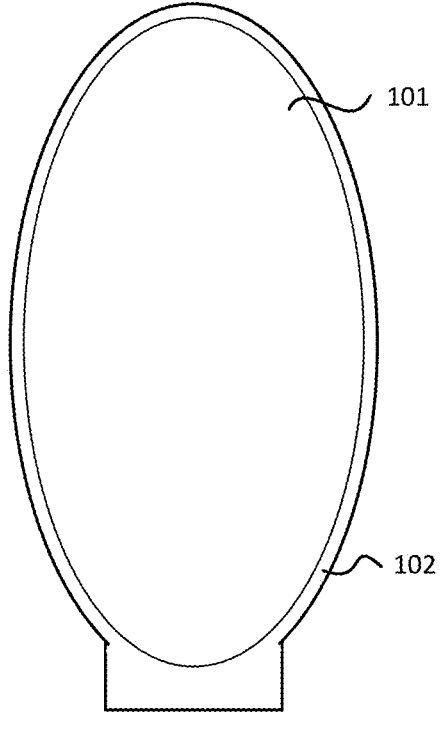
FIG. 1 schematically illustrates a display panel having an elliptical shape in the related art.

Various embodiments will now be described in detail with reference to the drawings, which are provided as illustrative examples of the disclosure so as to enable those skilled in the art to practice the disclosure.

Notably, the figures and the examples below are not meant to limit the scope of the present disclosure. Where certain elements of the present disclosure may be partially or fully implemented using known components (or methods or processes), only those portions of such known components (or methods or processes) that are necessary for an understanding of the present disclosure will be described, and the detailed descriptions of other portions of such known components (or methods or processes) will be omitted so as not to obscure the disclosure. Further, various embodiments encompass present and future known equivalents to the components referred to herein by way of illustration.

As used herein and in the appended claims, the singular form of a word includes the plural, and vice versa, unless the context clearly dictates otherwise. Thus, when reference is made to the singular, the plurals of the respective terms are generally included. Similarly, the words "comprise", "include" "contain", "has" and grammatical variations are to be interpreted inclusively rather than exclusively and indicate that additional elements may be present in addition to those listed. Where used herein the term "examples" particularly when followed by a listing of terms is merely exemplary and illustrative, and should not be deemed to be exclusive or comprehensive.

As used herein, the term "disposed on . . . " does not refer to a specific geometric orientation of the final stack in the display panel or display device with respect to a direction of a gravitational force but rather indicates a way of manufacturing the stack, which, after manufacturing, could, in general, be placed in any geometric orientation, also such as turned upside down. The terms "first", "second", "third", etc. are used for descriptive purposes only and are not to be construed as indicating or implying relative importance and order of formation.

In the process of preparing an OLED display device, in order to form respective pixels for displaying an image, it is generally necessary to first form a pixel defining layer including a plurality of pixel defining openings arranged in an array, and then to form a layer of light-emitting material in the plurality of pixel defining openings of the pixel defining layer.

In the related art, inkjet printing technology is usually used to form the layer of light-emitting material by printing light-emitting ink in the pixel defining openings. This is because inkjet printing technology has the advantages of being able to print in monochrome and save material. Inkjet printing technology requires that the light-emitting ink is printed precisely into the pixel defining openings of the pixel defining layer according to a set automatic device production recipe that includes print configuration parameters, such as the row number and column number of pixels in one print.

Due to the limitations of storage and operation of the printing device, the smallest unit of the automatic device production recipe is usually a rectangle. This manner is advantageous for a rectangular display panel with a regular shape. However, in the design and production of special-shaped display panels, this printing manner results in a significant operational load and increases the Tact Time of the product.

FIG. 1 schematically illustrates a display panel having an elliptical shape. The elliptical display panel typically has a display area 101 for displaying images and a peripheral area 102 encircling the display area 101. Since the display panel in FIG. 1 has an elliptical shape, its display area (AA area) 101 is also elliptical. In order for the printing device to print the light-emitting material (also known as "light-emitting ink") into each pixel precisely, the display area 101 of the display panel needs to be divided into N rectangular pixel defining blocks for printing, one rectangular pixel defining block being printed at a time. This means that the automatic production recipe set up for the printing device requires N adjustments to the print configuration parameters to complete the printing of N rectangular pixel defining blocks.

Figure 2:
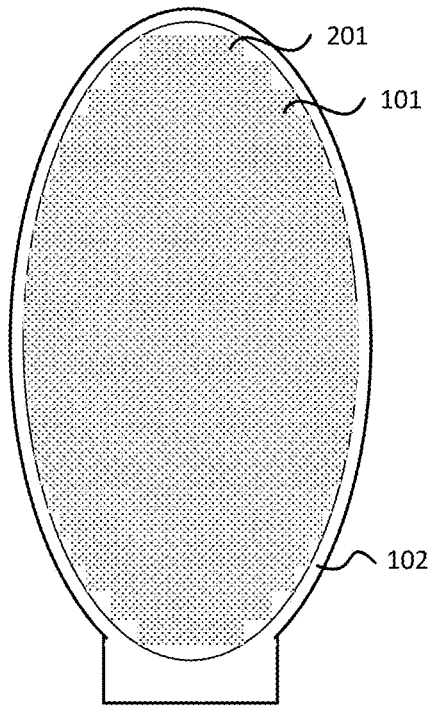
FIG. 2 schematically illustrates an elliptical display panel having an effective display area divided into fewer rectangular pixel defining blocks in the related art.

With a smaller value of N, this printing method does not significantly increase the operational load on the printing device. However, with a smaller value of N, the edges of the display area 101 will appear significantly jagged. FIG. 2 schematically illustrates an elliptical display panel having an effective display area divided into fewer rectangular pixel defining blocks. As shown in FIG. 2, the display area 101 is divided into fewer rectangular pixel defining blocks 201 (e.g., 23), which will result in a very unrounded edge of the effective display area 101, having a distinct jagged structure. When displayed, the edge of the display area will have graininess or jaggedness, thereby seriously affecting the display effect of the display device.

In order to make the special-shaped display panel have a sufficiently high PPI (pixels per inch) and a good display effect, N is generally chosen to be large, e.g., N is greater than 1000. However, with a large value of N, the recipe of the printing device needs to contain multiple adjustments of the printing configuration parameters, e.g., more than 1000 times. This significantly increases the operating load on the printing device as well as the tack time of the product.

Figure 3:
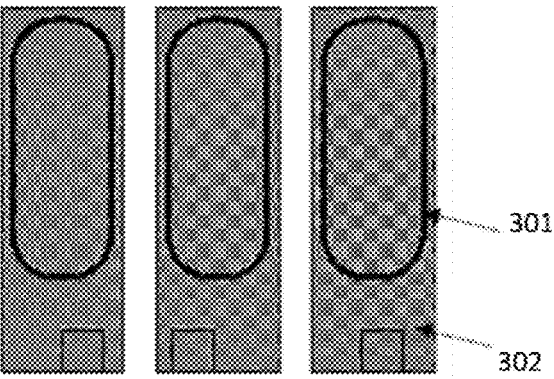
FIG. 3 schematically illustrates pixel defining openings and anode patterns in the display area of the display panel in the related art.

In the related art, the opening pattern (also called "pixel defining opening") of the pixel defining layer is disposed in the display area of the display panel, and corresponds to the anode pattern. FIG. 3 schematically illustrates the pixel defining openings and anode patterns in the display area of the display panel in the related art. As shown in FIG. 3, the pixel defining openings 301 of the pixel defining layer are provided on the anode patterns 302.

In embodiments of the present disclosure, the pixel defining opening pattern of the pixel defining layer is extended to the peripheral area of the display panel such that the pixel defining layer is divided into a plurality of larger rectangular pixel defining blocks. With this configuration, on the one hand, printing may be performed taking a larger rectangular pixel defining block as a unit, thereby reducing the printing load of the printing device and increasing the printing speed; on the other hand, the jagged border formed by the plurality of larger rectangular pixel defining blocks may be transferred to the peripheral area of the display panel, thereby maintaining high resolution as well as high image quality.

It is to be noted that the embodiments described herein are explained and illustrated using an elliptical display panel as an example. It should be understood that embodiments of the present disclosure are also suitable for non-rectangular display panels having other shapes, such as, circles, triangles, semicircles, hearts, or trapezoids. Further, the embodiments described herein are explained and illustrated with the first pixel defining blocks parallelly arranged in the longitudinal direction. It should be understood that embodiments of the present disclosure are also suitable for the case where the first pixel defining blocks are parallelly arranged in the transverse direction.

It should also be noted that in the embodiments described herein, the "column number of pixel defining openings" is referenced only relative to the orientation of the display panel in the accompanying drawings and the manner in which the first pixel defining blocks are divided, and does not constitute a limitation of the present disclosure. Depending on the context, "column number of pixel defining openings" and "row number of pixel defining openings" may have equivalent meaning. In the case where the display panel is rotated 90 degrees clockwise or counterclockwise with respect to the orientation in the accompanying drawings, or where the division of the pixel defining blocks of the pixel defining layer is changed from by pixel rows to by pixel columns, the "column number of pixel defining openings" and the "row number of pixel defining openings" may also be changes to the "row number of pixel defining openings" and the "column number of pixel defining openings", respectively.

Figure 4:
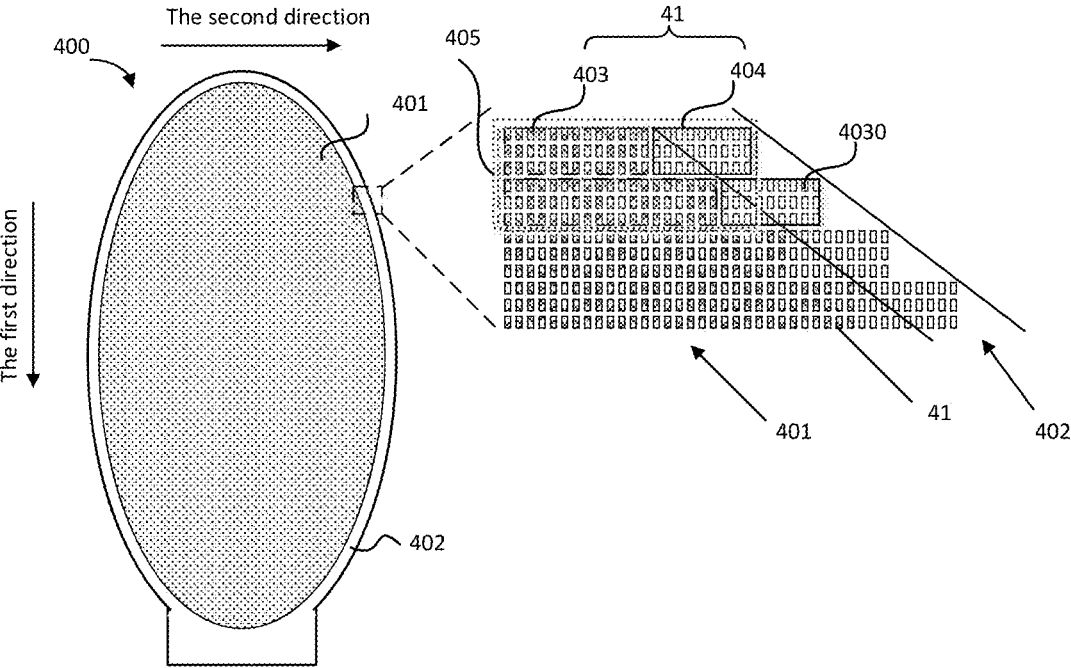
FIG. 4 schematically illustrates a schematic display panel and a partially enlarged view of the display panel in accordance with one or more embodiments of the present disclosure.

FIG. 4 schematically illustrates a schematic display panel in accordance with one or more embodiments of the present disclosure. A partially enlarged view of the display panel is also illustrated on the right side of FIG. 4. As shown in FIG. 4, the display panel 400 has a display area 401 and a peripheral area 402 at least partially encircling the display area 401. In the example shown in FIG. 4, both the display area 401 and the peripheral area 402 are non-rectangular, e.g., elliptical.

The display panel 400 includes a pixel defining layer 41 that includes a plurality of first pixel defining blocks 403 disposed in the display area 401 and parallelly arranged in a first direction (e.g., a longitudinal direction), and at least one second pixel defining block 404 in the peripheral area

402 as an extension of at least one of the plurality of first pixel defining blocks 403 in a second direction to the peripheral area 402, the second direction being substantially perpendicular to the first direction. In embodiments of the present disclosure, as used herein, the term "perpendicular" is a broad term and shall be given a meaning that is ordinary and customary to one of ordinary skill in the art, and not limited to a particular or customized meaning. The term may specifically refer to, but is not limited to, an angle between the first and second directions in the range of, for example, 80° to 100° or 85° to 95°.

Each first pixel defining block 403 and each second pixel defining block 404 extend in the second direction and includes multiple columns of pixel defining openings 4030. Adjacent first pixel defining blocks 403 have different lengths in the second direction (e.g., the lateral direction), i.e., have different columns of pixel defining openings. Each second pixel defining block 404 includes a column number of pixel defining openings greater than or equal to the difference in the column numbers of pixel defining openings of two adjacent first pixel defining blocks 403.

In one or more embodiments of the present disclosure, the extension of the first pixel defining block 403 by the second pixel defining block 404 allows the first pixel defining layer 41 to be reclassified to include at least one third pixel defining block 405. Each third pixel defining block 405 includes at least two adjacent first pixel defining blocks 403 and at least portions of the second pixel defining blocks 404 as the extensions of the at least two adjacent first pixel defining blocks 403, and each third pixel defining block 405 has a column number of pixel defining openings equal to a sum of the column number of pixel defining openings of the one of the at least two adjacent first pixel defining blocks 403 having the least columns of pixel defining openings and the column number of pixel defining openings of the second pixel defining block 404.

It should be noted that, for easy of illustration, the first pixel defining block is delimited by a chain line box, the second pixel defining block is delimited by a solid line box, and the third pixel defining block is delimited by a dotted dashed line box in FIG. 4. However, these boxes do not exist in the actual product. Further, for easy of illustration and printing ink, the pixel definition layer is intentionally artificially divided into multiple pixel defining blocks (the first, second, and third pixel defining blocks), but the pixel defining layer is a complete layer in the actual product and is not divided into pixel defining blocks.

The display panel provided according to the embodiments of the present disclosure, by the extension of the first pixel defining block 403 by the second pixel defining block 404 to the peripheral area 402, allows at least two first pixel defining blocks 403 and the second pixel defining block 404 to be combined together into a larger third pixel defining block 405, thus reducing the total number of pixel defining blocks. With this configuration, on the one hand, printing may be performed in larger third pixel defining blocks 404, thereby reducing the operational load on the printing device and reducing the tack time of the product. On the other hand, the distinct jagged border formed by larger third pixel defining blocks 405 may be transferred to the peripheral area 402 of the display panel that is not used for display, and when displayed, the edge of the display area 401 used for displaying images is not grainy and jagged, thereby allowing high image resolution as well as high image display quality to be maintained.

With continued reference to FIG. 4, there may be a plurality of second pixel defining blocks 404. Each first pixel defining block 403 has a second pixel defining block 404 corresponding thereto for extending from it. Specifically, each of the plurality of second pixel defining blocks 404 is connected to one of the plurality of first pixel defining blocks 403, and each of the plurality of second pixel defining blocks 404 has a row number of pixel defining openings equal to a row number of pixel defining openings of the first pixel defining block 403 connected to the second pixel defining block 404, wherein the row direction of pixel defining openings of the first pixel defining block 403 and the second pixel defining block 404 are oriented in the second direction.

For a display panel having an axisymmetric shape about the first direction, each second pixel defining block 404 may include a first portion and a second portion as extensions of the respective first pixel defining block 403 to the peripheral areas disposed on both sides of the respective first pixel defining block 403, respectively. That is, each first pixel defining block 403 may correspond to a first portion and a second portion of the second pixel defining block 404 extending toward the left peripheral area and the right peripheral area, respectively. In this case, the column number of pixel defining openings of each second pixel defining block 404 is equal to a sum of a column number of pixel defining openings of the first portion extending toward the left peripheral area and a column number of pixel defining openings of the second portion extending toward the right peripheral area. For ease of explanation and illustration, in embodiments of the present disclosure, only the second pixel defining block 404 extending toward one side (e.g., to the right) is illustrated as an example. The same is appropriate for the present disclosure for the second pixel defining block 404 extending toward both sides.

In one or more embodiments of the present disclosure, the column number of pixel defining openings $N_2$ of each second pixel defining block 404 may be represented by the following equation:

$$N_2 \geq K * \delta_N, \tag{1}$$

where K is a positive integer and $\delta_N$ is the difference between the column numbers of pixel defining openings of two adjacent first pixel defining blocks 403.

According to the equation, K+1 first pixel defining blocks 403 may be combined into a third pixel defining block 405. More specifically, the K+1 first pixel defining blocks 403, the second pixel defining block 404 that is an extension of the one of the K+1 first pixel defining blocks 403 with shortest length, and a portion of the second pixel defining blocks 404 corresponding to the remaining K first pixel defining blocks 403 are combined into a third pixel defining block 405.

In an example embodiment, if the column numbers of pixel defining openings of adjacent first pixel defining blocks 403 differ by 6 columns, the column number of pixel defining openings of the second pixel defining block 404 for extending the first pixel defining block 403 may be greater than or equal to 6 columns, for example, equal to 9 columns, 10 columns, 12 columns, 16 columns, 18 columns, 21 columns, or 24 columns. In one or more embodiments of the present disclosure, the column number of pixel defining openings of each second pixel defining block 404 depends not only on the difference in the column numbers of pixel defining openings of adjacent first pixel defining blocks 403, but also on a width of the peripheral area and a pitch of the pixel defining openings.

With continued reference to FIG. 4, the pixel defining layer 41 may be divided into a plurality of first pixel defining blocks 403 by rows, each first pixel defining block 403 may include, for example, three rows of pixel defining openings, and the column numbers of pixel defining openings of adjacent first pixel defining blocks 403 differ by six columns. In this example, each second pixel defining block 404 may include nine columns of pixel defining openings. In this case, the extension of the first pixel defining block 403 by the second pixel defining block 404 may allow the two adjacent first pixel defining blocks 403 to be combined into a third pixel defining block 405. In the embodiment shown in FIG. 3, the third pixel defining block 405 includes two first pixel defining blocks 403, a second pixel defining block 404 for extending the one (the upper first pixel defining block) of the two first pixel defining blocks 403 with fewer columns of pixel defining openings, and a portion of the second pixel defining block 404 (the left 3 columns of pixel defining openings of the second pixel defining block 404) for extending the other one (the lower first pixel defining block) of the two first pixel defining blocks 403 with more columns of pixel defining openings. Each third pixel defining block 405 has a column number of pixel defining openings equal to the sum of the column number of pixel defining openings of the upper one of the two adjacent first pixel defining blocks 403 and the column number of pixel defining openings of the corresponding second pixel defining block 404.

In one or more example embodiments, assuming that the pixel defining layer 41 may have $N_f$ first pixel defining blocks 403 in the display area 401, the column numbers of pixel defining openings of adjacent first pixel defining blocks 403 differ by $\delta_N$, and the second pixel defining block 404 corresponding to each first pixel defining block 403 has $N_2$ columns of pixel defining openings, the number of third pixel defining blocks 405 $N_p$ is represented by the following equation:

$$N_p = N_f/([N_2/\delta_N] + 1), \qquad (2)$$

In the equation (2), the mathematical symbol [ ] indicates rounding down $N_2/\delta_N$.

According to the equation (2), each third pixel defining block 405 may include $[N_2/\delta_N]+1$ first pixel defining blocks 403. i.e., $[N_2/\delta_N]+1$ first pixel defining blocks 403 may be combined into one third pixel defining block 405.

As an example, in the case where $N_f$=1000, $\delta_N$=6, and $N_2$=18, then $[N_2/\delta_N]+1$=4. This means that four first pixel defining blocks 403 may be combined into one third pixel defining block 405. Specifically, each third pixel defining block 405 may include four first pixel defining blocks 403, a second pixel defining block 403 corresponding to the one of first pixel defining blocks 403 with the minimum number of pixel openings, and a portion of the second pixel defining blocks 403 corresponding to the remaining three first pixel defining blocks 403. Thus, a total of 250 third pixel defining blocks 405 may be formed. The number of prints may be reduced to one-fourth of the number of prints taking the first pixel defining block 403 as a unit. The number of prints and the operating load of the printing device are significantly reduced without reducing the image resolution and image display quality.

As another example, in the case where $N_f$=1000, $\delta_N$=6, and $N_2$=15, then $[N_2/\delta_N+1]$=3, which means that three first pixel defining blocks 403 and at least one second pixel defining block 404 associated therewith may be combined into a third pixel defining block 405, so that a total of 333 third pixel defining blocks 405 may be formed. There is a remaining first pixel defining block 403 that is not assigned to any of the third pixel defining block 404. In this case, the remaining first pixel defining block 403 may be combined with the second pixel defining block 404 as an extension of the remaining first pixel defining block 403, to form a fourth pixel defining block. With this configuration, when printing the light-emitting ink, the 333 third pixel defining blocks 405 may be printed with the third pixel defining block 405 as a print unit, while the fourth pixel defining block may be printed with the fourth pixel defining block as a print unit. Thus, a total of 334 prints are needed. Again, the number of prints and the operational load of the printing device are significantly reduced without reducing the image resolution and image display quality.

As yet another example, in the case where $N_f$=1000, $\delta N$=6, and $N_2$=16, then $[N_2/\delta_N+1]$=3, which means that the three first pixel defining blocks 403 may be combined into one third pixel defining block 405, thus forming a total of 333 third pixel defining blocks 405. There are two remaining first pixel defining blocks 403 that are not assigned to any of the third pixel defining blocks 405. In this case, the two remaining first pixel defining blocks 403 are combined with a second pixel defining block 404 that is an extension of the one of the two remaining first pixel defining blocks 403 having smaller columns of pixel defining openings and a portion of another second pixel defining block 404 that is an extension of the other first pixel defining block 403 to form a fourth pixel defining block. With this configuration, when printing the light-emitting ink, the 333 third pixel defining blocks 405 may be printed with the third pixel defining block 405 as a print unit, while the fourth pixel defining block may be printed with the fourth pixel defining block as a print unit. Thus, a total of 334 prints are needed. Again, the number of prints and the operating load of the printing device are significantly reduced without reducing the image resolution and image display quality.

Figure 5:
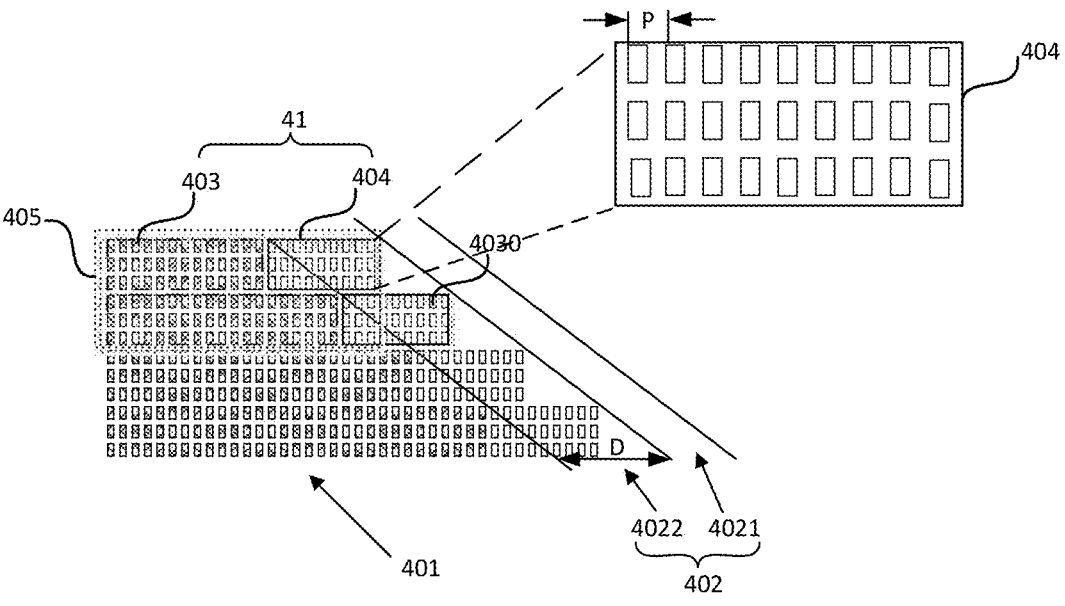
FIG. 5 schematically illustrates a partially enlarged view of another display panel in accordance with one or more embodiments of the present disclosure.

FIG. 5 schematically illustrates a partially enlarged view of another display panel in accordance with one or more embodiments of the present disclosure. As shown in FIG. 5, in one or more embodiments of the present disclosure, the peripheral area 402 of the display panel may include a package area 4021 and a dummy area 4022 disposed between the display area 401 and the package area 4021. The plurality of second pixel defining blocks 404 may be disposed in the dummy area 4022. Setting the second pixel 404 blocks in the dummy area 4022 between the display area 401 and the package area 4021 neither affects the overall package effect of the display panel, nor affects the display effect of the display area of the display panel. For more clarity, an enlarged view of the second pixel block 404 is shown in the upper right of FIG. 5.

In embodiments of the present disclosure, the package area 4021 may further include a bezel area and a wiring & package area between the bezel area and the dummy area. The bezel area may be used as the outer bezel of the display panel. The wiring & package area may be used for wiring the VSS Bus and for packaging the display panel.

It may be appreciated that in order to minimize the number of adjustments of the print configuration parameters, i.e. to reduce the number of prints, it may be possible that each third pixel defining block 405 may include as many first pixel defining blocks 403 as possible, which requires that the second pixel defining block 404 in the peripheral area 402 contains as many columns of pixel defining openings as possible. For this purpose, the pixel defining openings of the second pixel defining block 404 may occupy the entire dummy area 4022 of the peripheral area 402. In this case, the column number of pixel defining openings N2 of each second pixel defining block 404 may satisfy the following equation (3):

$$K * \delta_N \leq N_2 \leq D/P, \tag{3}$$

where D is a distance in the second direction between two boundaries of the dummy area, and P is a pitch of the pixel defining openings of the second pixel defining block 404.

In one or more embodiments of the present disclosure, the display panel 400 may further include a layer of light-emitting material having a plurality of light-emitting units. At least some of the plurality of light-emitting units may be formed in the pixel-defining openings of the third pixel-defining block 405.

In the case where $N_2/\delta_N$ is an integer, all of the plurality of first pixel defining blocks 403 may be assigned to the respective third pixel defining block 404. Thus, when printing the light-emitting material, the plurality of light-emitting units may be printed with the third pixel defining block 405 as a print unit into the plurality of pixel defining openings of the third pixel defining blocks 405, respectively.

In the case where $N_2/\delta_N$ is not an integer, then there are remaining first pixel defining blocks 403 that are not assigned to any of the at least one third pixel defining block 405. The number of remaining first pixel defining blocks 403 is $\{N_2/\delta_N\}$, where the symbol $\{\ \}$ indicates that the fractional part of $N_2/\delta_N$ is taken. In this case, the remaining first pixel defining blocks 403 and at least a portion of the second pixel defining blocks 404 as extensions of the remaining first pixel defining blocks 403 may be combined to form a fourth pixel defining block.

When printing the light-emitting material, some of the light-emitting units may be printed in the plurality of pixel defining openings of the third pixel defining blocks 405 with the third pixel defining block 405 as a print unit and some other of the light-emitting units may be printed in pixel defining openings of the fourth pixel defining block with the fourth pixel defining block as a print unit. It may be appreciated that there may be some pixel defining openings of the second pixel defining block 404 that are not assigned to the third pixel defining block 405 when combined into the third pixel defining block 405. As shown in FIGS. 4 and 5, two first pixel defining blocks 403, a full second pixel defining block 404, and a portion (e.g., three columns on the left) of the pixel defining openings of another second pixel defining block 404 are assigned to a third pixel defining block 405, while the remaining pixel defining openings (e.g., five columns on the right) of the other second pixel defining block 404 are not assigned to the third pixel defining block. In that case, no light-emitting units are provided to the remaining pixel defining openings of the second pixel defining block. In this way, when printing the light-emitting material, it may be possible to print only in units of the third pixel defining block 405, and the remaining pixel defining openings of the second pixel defining block 404 are not printed with the light-emitting material.

In one or more embodiments of the present disclosure, the display panel 400 may also include an organic common-pass layer configured to enable the layer of light-emitting material to emit light. FIG. 13 schematically illustrates a cross-sectional view of the organic common-pass layer and the light-emitting material layer. As shown in FIG. 13, the organic common-pass layer 1300 may include, for example, a hole injection layer 1301, a hole transport layer 1302, an electron injection layer 1303, and an electron transport layer 1304. In some embodiments, the organic common-pass layer 1300 may be formed in all of the pixel defining openings of the first pixel defining blocks and the second pixel defining blocks. In this way, the organic common-pass layer 1300 may be vaporized in the pixel defining openings of the first pixel defining blocks 403 and the second pixel defining blocks 404 in a full-face vaporization, i.e., in the display area 401 and the peripheral area 402 of the display panel. Accordingly, the layer of light-emitting material 1305 may be printed with the third pixel defining block 405 as a print unit only, and the remaining pixel defining openings of the second pixel defining block 404 that are not assigned to the third pixel defining block 405 may not be printed with the light-emitting material 1305.

Figure 6:
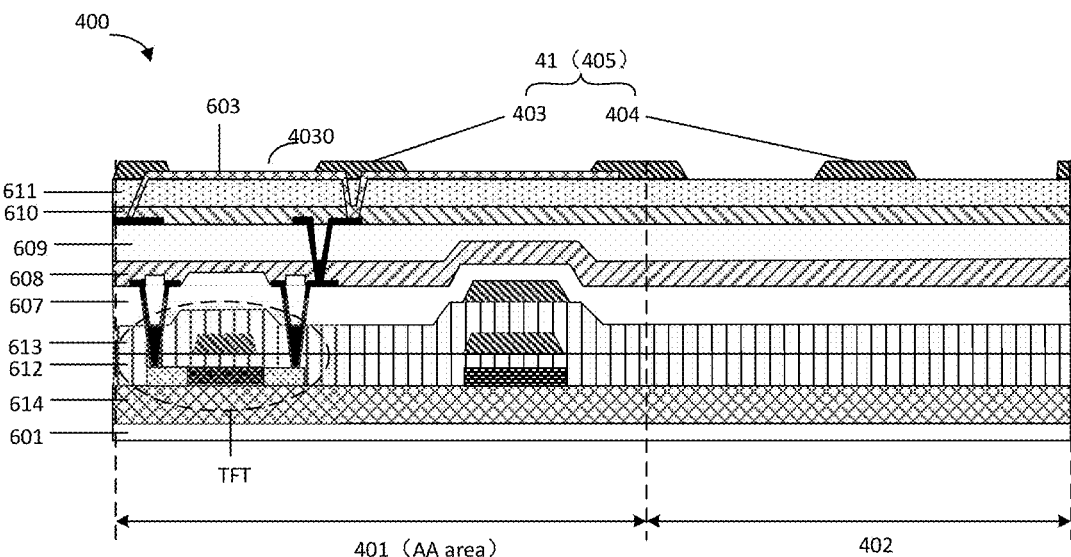
FIG. 6 schematically illustrates a partial cross-sectional view of a display panel according to one or more embodiments of the present disclosure.

FIG. 6 schematically illustrates a partial cross-sectional view of a display panel in accordance with one or more embodiments of the present disclosure. As shown in FIG. 6, in one or more embodiments of the present disclosure, the display panel 400 may also include a substrate 601 and a plurality of first electrodes 603 on a side of the pixel defining layer 41 close to the substrate 601.

In one or more embodiments of the present disclosure, the plurality of first electrodes 603 are located in the display area 401 (also referred to as the AA area) of the display panel 400, and the orthographic projections of the plurality of first electrodes 603 on the substrate 601 overlap at least partially with the orthographic projections of the plurality of pixel defining openings of the plurality of first pixel defining blocks 403 on the substrate 601, respectively. In some embodiments of the present disclosure, the orthographic projections of the plurality of first electrodes 603 on the substrate are separated from the orthographic projections of the plurality of pixel defining openings of the plurality of second pixel defining blocks 404 on the substrate.

With this configuration, the first electrode 603 is located in the display area 401 of the display panel 400, and in the case where a voltage is applied to the first electrode 603, the voltage between the first electrode 603 and the second electrode on the other side of the pixel defining layer 41 may drive the light-emitting units of the display area 401 to emit light, so that images may be displayed at high resolution without jaggedness or graininess. Since the peripheral area 402 of the display panel 400 is not used for display, the first electrode 603 may not be provided in the peripheral area 402, which may save the material used for the first electrode 603. However, it should be understood that other embodiments are also possible. For example, the first electrode 603 may also extend to the peripheral area 402 of the display panel 400.

With continued reference to FIG. 6, the display panel 400 may also include a thin film transistor (TFT) disposed on the substrate 601, a first dielectric layer 607 disposed on a side of the thin film transistor TFT away from the substrate 601, a second dielectric layer 608 disposed on a side of the first dielectric layer 607 away from the substrate 601, a third dielectric layer 609 disposed on a side of the second dielectric layer 608 away from the substrate 601, a passivation layer 610 disposed on a side of the third dielectric layer 609 away from the substrate 601, a planarization layer 611 disposed on a side of the passivation layer 610 away from the substrate 601, a buffer layer 614 disposed between the substrate 601 and the TFT, a first gate insulation layer 612 and a second gate insulation layer 614. The first electrode 603 is located on the side of the planarization layer 611 away from the passivation layer 610 and is electrically connected to the source/drain electrodes of the TFT through one or more vias. The pixel defining layer 41 is located on the side of the first electrode 603 away from the substrate 601, and the pixel defining openings of the pixel defining layer 41 expose at least a portion of the first electrode 603.

In one or more embodiments of the present disclosure, as shown in FIG. 6, the substrate 601, the pixel defining layer 41, and the intermediate layer therebetween of the display panel 400 all may extend to the peripheral area 402 of the display panel, and the pixel defining layer 41 has pixel defining openings in both the display area 401 and the peripheral area 402, and the first electrode 603 is disposed only in the display area 401 of the display panel. In the embodiment shown in FIG. 6, the pixel defining openings of the pixel defining layer 41 in the display area 601 correspond to the pixel defining openings of the first pixel defining blocks 403, and the pixel defining openings of the pixel defining layer 41 in the peripheral area 402 correspond to the pixel defining openings of the second pixel defining blocks 404.

In one or more embodiments of the present disclosure, the pixel defining layer 41 may include a plurality of vertical pixel defining strips and a plurality of horizontal pixel defining strips that cross vertically and horizontally to define the plurality of pixel defining openings. Depending on how the pixels are arranged, the pixel defining layer 41 may have two patterns, a pixel bank pattern in which the horizontal pixel defining strips and the vertical pixel defining strips have substantially the same thickness and a line bank pattern in which the thickness of the horizontal pixel defining strips is less than the thickness of the vertical pixel defining strips.

Figure 14:
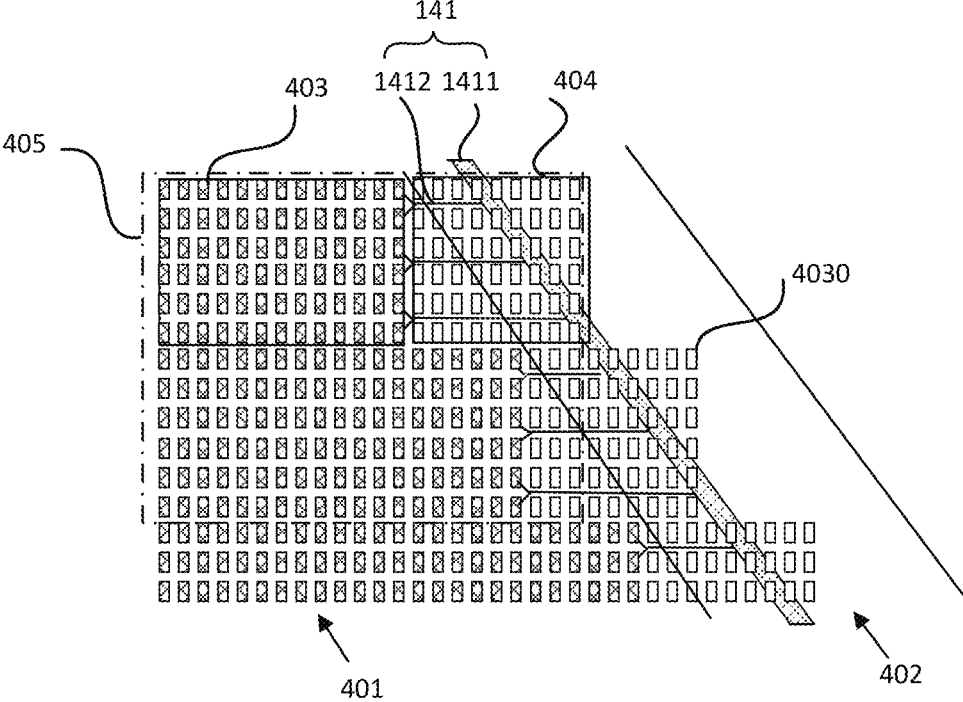
FIG. 14 schematically illustrates a partially enlarged view of another display panel in accordance with one or more embodiments of the present disclosure.

FIG. 14 schematically illustrates a partially enlarged view of another display panel in accordance with one or more embodiments of the present disclosure. As shown in FIG. 14, the display panel may also include an initialization signal line 141 located in the peripheral area 402, which includes a body portion 1411 extending around a boundary between the peripheral area 402 and the display area 401 (e.g., substantially parallel to the boundary), and a plurality of protrusion portions 1412 protruding from the body portion 1411 toward the display area 401 in the second direction. The orthographic projection of at least one of the plurality of protrusion portions on the substrate is between the orthogonal projections of the adjacent two rows of pixel defining openings of the second pixel defining block 404 on the substrate such that the individual protrusion portion 1412 provides signals for the adjacent two rows of pixels defined by the adjacent two rows of pixel defining openings of the first pixel defining block 403 extended by the second pixel defining block 404. Since the second pixel defining block 404 is merely used for extending the first pixel defining block 403 for the purpose of facilitating the printing of light-emitting material and is not used to display an image, there is no need to provide signals for the pixels defined by the second pixel defining block 404. Each protrusion portion 1412 may provide signals for two adjacent rows of pixels of the first pixel defining block 403.

FIG. 7A schematically illustrates a plan view of a pixel bank pattern of the pixel defining layer and the pixel distribution formed by the pixel bank pattern. FIG. 7B schematically illustrates a cross-sectional view along line AA in FIG. 7A. As shown in FIGS. 7A and 7B, in the pixel bank pattern, the horizontal pixel defining strips 71 and the vertical pixel defining strips 72 have substantially the same thickness, such that when printing the light-emitting ink (light-emitting material), the light-emitting ink is confined within the pixel defining openings 73 defined by the horizontal pixel defining strips 71 and the vertical pixel defining strips 72, thereby forming the pixel distribution shown in FIG. 7A, in which the colors of the pixels within the adjacent pixel defining openings 4030 may be different. Alternatively, the pixels in the same column of pixel defining openings 73 defined by adjacent vertical pixel defining strips 72 may have the same color.

FIG. 8A schematically illustrates a plan view of a line bank pattern of the pixel defining layer and a pixel distribution formed by the line bank pattern. FIG. 8B schematically illustrates a cross-sectional view along the line BB in FIG. 8A. As shown in FIGS. 8A and 8B, the thickness of the horizontal pixel defining strips 81 is less than the thickness of the vertical pixel defining strips 82 in the line bank pattern. When printing ink of the light-emitting layer into the channel between adjacent vertical pixel defining strips 82 of the line bank pattern, the ink may across the horizontal pixel defining strips 81 and flow within the channel defined by the adjacent vertical pixel defining strips 82, thereby forming the pixel distribution as shown in FIG. 8A, in which the colors of the pixels within the same channel may be the same and the pixel colors within adjacent channels may be different.

In one or more embodiments of the present disclosure, the first pixel defining block in the display area and the second pixel defining block in the peripheral area may have the pixel bank pattern shown in FIG. 7A, the line bank pattern shown in FIG. 8A, or a combination thereof.

Figure 9:
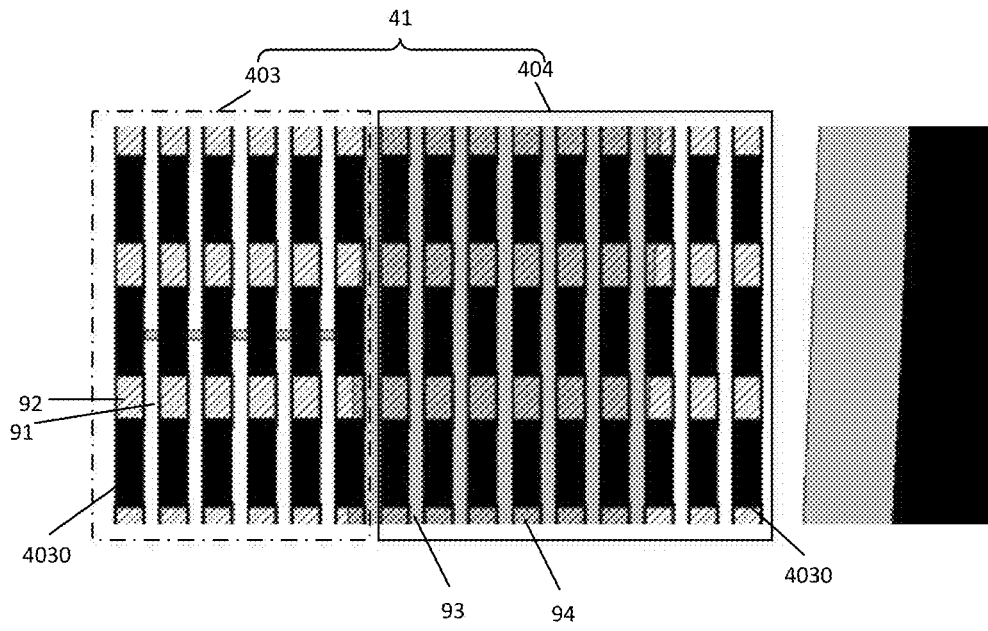
FIG. 9 schematically illustrates a pattern of the first pixel defining block and the second pixel defining block in accordance with one or more embodiments of the present disclosure.

FIG. 9 schematically illustrates a pattern of the second pixel defining block and the first pixel defining block in accordance with one or more embodiments of the present disclosure. In the embodiment illustrated in FIG. 9, both the first pixel defining block 403 in the display area 401 and the second pixel defining block 404 in the peripheral area 402 may have a line bank pattern. As shown in FIG. 9, the first pixel defining block 403 may include a plurality of first vertical pixel defining strips 91 extending in a vertical direction and spaced apart in a horizontal direction, and a plurality of first horizontal pixel defining strips 92 extending in a horizontal direction and spaced apart in a vertical direction. The first vertical pixel defining strips 91 and the first horizontal pixel defining strips 92 intersect to define a plurality of pixel defining openings 4030. In this embodiment, the thickness of the first vertical pixel defining strip 91 is greater than the thickness of the first horizontal pixel defining strip 92. As an example, the thickness of the first horizontal pixel defining strip 91 may be in the range of 0.1-1.0 μm, and the thickness of the first vertical pixel defining strip 92 may be in the range of 0.5-50 μm.

As an alternative embodiment, the first pixel defining block 403 may have a pixel bank pattern. In this embodiment, the thickness of the first vertical pixel defining strip 91 is equal to the thickness of the first horizontal pixel defining strip 92. As an example, the thickness of both is in the range of 0.5-50 μm.

With continued reference to FIG. 9, the second pixel defining block 404 may include a plurality of second vertical pixel defining strips 93 extending in the vertical direction and spaced apart in the horizontal direction, and second horizontal pixel defining strips 94 extending in the vertical direction and spaced apart in the horizontal direction. The second horizontal pixel defining strips 94 serve as extensions of the first horizontal pixel defining strips 92 to the peripheral area 402. The second vertical pixel defining strips 93 and the second horizontal pixel defining strips 94 intersect to define a plurality of pixel defining openings 4030. In this embodiment, the thickness of the second vertical pixel defining strip 93 is greater than the thickness of the second horizontal pixel defining strip 94. As an example, the thickness of the second horizontal pixel defining strip 94 may be in the range of 0.1-1.0 µm, and the thickness of the first vertical pixel defining strip 93 may be in the range of 0.5-50 µm.

As an alternative embodiment, the second pixel defining block 404 may have a pixel bank pattern. In this embodiment, the thickness of the second vertical pixel defining strip 93 is equal to the thickness of the second horizontal pixel defining strip 94. As an example, the thickness of both is in the range of 0.5-50 µm.

Figure 10:
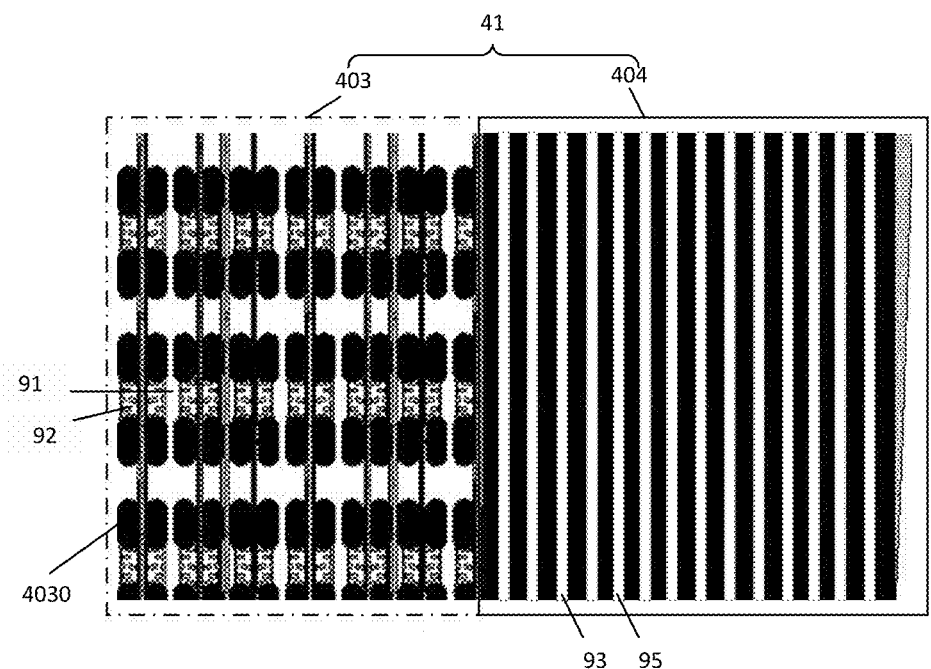
FIG. 10 schematically illustrates another pattern of the first pixel defining block and the second pixel defining block in accordance with one or more embodiments of the present disclosure.

FIG. 10 schematically illustrates another pattern of the first pixel defining block and the second pixel defining block in accordance with one or more embodiments of the present disclosure. In the embodiment shown in FIG. 10, the first vertical pixel defining strips 91 and the first horizontal pixel defining strips 92 of the first pixel defining block 403 intersect to form a line bank pattern, and the second pixel defining block 404 may include only the second vertical pixel defining strips 93 but not include the second horizontal pixel defining strips. In this way, the same column of the pixel defining openings of the second pixel defining block 404 are connected to form a pixel defining channel 95.

In fact, since the light-emitting units in the pixel defining openings of the second pixel defining block 404 in the peripheral area 402 do not emit light, there is no need to define a plurality of pixel defining openings 4030 to form a plurality of individual pixels as the first pixel defining block 403. Thus, when printing the light-emitting material, the light-emitting material may flow freely within the plurality of pixel defining channels 95 defined by the second vertical pixel defining strips.

As already described above, in one or more embodiments of the present disclosure, each first pixel defining block 403 may be extended by the respective second pixel defining block 404. However, it will be appreciated that it is possible that only some of the first pixel defining blocks 403 are extended by the respective second pixel defining blocks 404 and that it is also feasible that some other of the first pixel defining blocks 403 are not extended by the second pixel defining block 404, as long as the total number of the printed pixel defining blocks may be reduced to some extent. In an example embodiment, the first pixel defining blocks 403 may be extended alternately. As an example, in the case where the three first pixel defining blocks 403 may be combined into one third pixel defining block 405, the second pixel defining blocks 404 may be arranged such that, in a top-down order, a first group of three first pixel defining blocks 403 are extended by three second pixel defining block 404 to combine into one third pixel defining block 405, followed by a second group of three first pixel defining blocks 403 not being extended, then a third group of three first pixel defining blocks 403 are extended by another three second pixel defining block 404 to combine into another third pixel defining block 405, and so on. However, other embodiments are possible.

In some embodiments of the present disclosure, a method for preparing a display panel is further provided. The method may prepare at least one display panel 400 according to the present disclosure, such as at least one display panel 400 according to one or more embodiments disclosed above and/or below in further detail. Thus, for optional embodiments of the method, reference might be made to the embodiments of the display panel 400. The method includes the following steps, which may be performed in a given order or in a different order. Further, additional method steps might be provided which are not listed. Further, two or more or even all of the method steps might be performed at least partially simultaneously. Further, a method step might be performed twice or even more than twice, repeatedly.

In one or more embodiments of the present disclosure, the display panel 400 has a display area 401 and a peripheral area 402 at least partially encircling the display area 401. The method includes providing a substrate 601, and forming a pixel defining layer 41 on the substrate 601, the pixel defining layer 41 including a plurality of first pixel defining blocks 403 disposed in the display area 401 and parallelly arranged in a first direction, each first pixel defining block 403 extending in a second direction perpendicular to the first direction and including a plurality of columns of pixel defining openings 4030 with a column direction in the first direction, adjacent first pixel defining blocks 403 having different columns of pixel defining openings, and at least one second pixel defining block 404 in the peripheral area 402 as an extension of at least one of the plurality of first pixel defining blocks 403 in the second direction to the peripheral area 402, each second pixel defining block 404 including a plurality of pixel defining openings 4030 arranged in an array, and each second pixel defining block 404 having a column number of pixel defining openings greater than or equal to the difference in the column numbers of pixel defining openings of two adjacent first pixel defining blocks 403.

FIG. 11 schematically illustrates a flowchart of a method for preparing a display panel in accordance with one or more embodiments of the present disclosure. As shown in FIG. 11, the method for preparing the display panel 400 may include steps S1002-S1008.

At step S1002, a substrate 601 is provided. The substrate 601 may include a semiconductor material such as monocrystalline silicon or polycrystalline silicon. In an alternative embodiment, substrate 601 may also be made of other hard or soft materials such as glass, plastic, etc. In some embodiments, one or more of electronic devices, semiconductor layers or wirings required for a display panel may be arranged on the substrate 601.

At step S1004, a plurality of first electrodes 603 are formed in an array arrangement in the display area 401 of the substrate 601. The first electrodes 603 may include, for example, an ITO material or other transparent conductive material.

At step S1006, a pixel defining layer 41 is formed on the plurality of first electrodes 603 and on the peripheral area 402 of the substrate 601. The pixel defining layer 41 includes a plurality of first pixel defining blocks 403 disposed in the display area 401 and parallelly arranged in the first direction, each first pixel defining block 403 including a plurality of columns of pixel defining openings 4030, adjacent first pixel defining blocks 403 having different columns of pixel defining openings, and at least one second pixel defining block 404 in the peripheral area 402 as an extension of at least one of the plurality of first pixel defining blocks 403 to the peripheral area 402, each second pixel defining block 404 including a plurality of columns of pixel defining openings 4030, and each second pixel defining block 404 having a column number of pixel defining openings greater than or equal to the difference in the column numbers of pixel defining openings of two adjacent first pixel defining blocks 403.

In this step, the extension of at least one of the plurality of first pixel defining blocks 403 by the at least one second pixel defining block 404 allows the pixel defining layer 41 to be reclassified to include at least one third pixel defining block 405, wherein each third pixel defining block 405 is assigned at least two adjacent first pixel defining blocks 403 and at least portions of the second pixel defining blocks 404 as the extensions of the at least two adjacent first pixel defining blocks 403, and each third pixel defining block 405 has a column number of pixel defining openings equal to a sum of the column number of pixel defining openings of the one of the at least two adjacent first pixel defining blocks 403 having the least column number of pixel defining openings and the column number of pixel defining openings of the second pixel defining block 404.

In this step, orthographic projections of the plurality of first electrodes 603 on the substrate 601 at least partially overlap orthographic projections of the plurality of pixel defining openings of the plurality of first pixel defining blocks 403 on the substrate 601, and the orthographic projections of the plurality of first electrodes 603 on the substrate 601 are separated from the orthographic projections of the plurality of pixel defining openings of the plurality of second pixel defining blocks 404 on the substrate 601.

At step S1008, a plurality of light-emitting units are formed in the pixel defining openings of the at least one third pixel defining block 405 to form a light-emitting material layer. In this embodiment, in the case where there is a remaining pixel defining opening of the at least one second pixel defining block 404 that is not assigned to the respective third pixel defining block 405, no light-emitting units are provided in the remaining pixel defining opening of the at least one second pixel defining block 404.

In this step, the plurality of light-emitting units may be formed in the pixel defining openings of the at least one third pixel defining block 405 by an inkjet printing technique.

In this step, for the same third pixel defining block 405, the plurality of light-emitting units are formed in the pixel defining openings 4030 of the third pixel defining block 405 with a single print configuration parameter, i.e., on kind of print configuration parameter, and for different third pixel defining blocks 405, the plurality of light-emitting units are formed in the pixel defining openings 4030 of the third pixel defining block 405 with different print configuration parameters.

In one or more embodiments of the present disclosure, the print configuration parameters may include for example a row number and a column number of light-emitting units printed in a single print.

In some embodiments of the present disclosure, there is further provided a display device including a display panel 400 in accordance with one or more embodiments of the present disclosure, such as at least one display panel 400 of one or more embodiments disclosed in detail above. Thus, for optional embodiments of this display panel 400, reference may be made to embodiments of the display device.

FIG. 12 schematically illustrates a display device 1100 in accordance with one or more embodiments of the present disclosure. As shown in FIG. 12, the display device 1100 may include a display panel 1101 and a drive circuit 1102 configured to provide a drive signal for driving the display panel.

The foregoing description of the embodiment has been provided for purpose of illustration and description. It is not intended to be exhaustive or to limit the application. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the application, and all such modifications are included within the scope of the application.

What is claimed is:

1. A display panel having a display area and a peripheral area at least partially encircling the display area, the display panel comprising:

a pixel defining layer which comprises:

a plurality of first pixel defining blocks disposed in the display area and parallelly arranged in a first direction, each first pixel defining block extending in a second direction perpendicular to the first direction and comprising a plurality of columns of pixel defining openings with a column direction in the first direction, and adjacent first pixel defining blocks having different columns of pixel defining openings;

at least one second pixel defining block disposed in the peripheral area and serving as an extension of at least one of the plurality of first pixel defining blocks in the second direction to the peripheral area, each second pixel defining block comprising a plurality of columns of pixel defining openings, and having a column number of pixel defining openings greater than or equal to the difference in the column numbers of pixel defining openings of two adjacent first pixel defining blocks, blocks, wherein the extension of the at least one of the plurality of first pixel defining blocks by the at least one second pixel defining block allows the pixel defining layer to be reclassified to comprise at least one third pixel defining block, wherein each third pixel defining block is assigned at least two adjacent first pixel defining blocks and at least portions of the second pixel defining blocks as the extensions of the at least two adjacent first pixel defining blocks, and wherein each third pixel defining block has a column number of pixel defining openings equal to a sum of the column number of pixel defining openings of the one of the at least two adjacent first pixel defining blocks having the least columns of pixel defining openings and the column number of pixel defining openings of the second pixel defining block; and a layer of light-emitting material having a plurality of light-emitting units, wherein, in the case where each of the plurality of first pixel defining blocks are assigned to the at least one third pixel defining block, the plurality of light-emitting units is respectively formed in a plurality of pixel defining openings of the at least one third pixel defining block; and wherein, in the case where there is a remaining first pixel defining block not assigned to the at least one third pixel defining block, the remaining first pixel defining block is combined with at least a portion of the second pixel defining block as the extension of the remaining first pixel defining block to form a fourth pixel defining block, some of the plurality of light-emitting units being formed in the plurality of pixel defining openings of the at least one third pixel defining block, and some other of the plurality of light-emitting units are formed in a plurality of pixel defining openings of the fourth pixel defining block, and wherein, there is a remaining pixel defining opening of the at least one second pixel defining block not assigned to the respective third pixel defining block, and no light-emitting unit is provided in the remaining pixel defining opening of the at least one second pixel defining block.

2. The display panel according to claim 1, wherein the at least one second pixel defining block comprises a plurality of second pixel defining blocks, one of the plurality of second pixel defining blocks is connected to one of the plurality of first pixel defining blocks, and each of the plurality of second pixel defining blocks has a row number of pixel defining openings equal to a row number of pixel defining openings of the first pixel defining block connected to the second pixel defining block, and wherein a row direction of the pixel defining openings of the first pixel defining block and the second pixel defining block oriented in the second direction.

3. The display panel according to claim 2, wherein the column number of pixel defining openings $N_2$ of each second pixel defining block satisfies:

$$N_2 \geq K * \delta_N,$$

wherein K is a positive integer and wherein $\delta_N$ is a difference in the column numbers of the pixel defining openings of the two adjacent first pixel defining blocks.

4. The display panel according to claim 3, wherein the peripheral area comprises a package area and a dummy area disposed between the display area and the package area, and wherein the plurality of second pixel defining blocks are disposed in the dummy area.

5. The display panel according to claim 4, wherein the column number of the pixel defining openings $N_2$ of each second pixel defining block satisfies:

$$K * \delta_N \leq N_2 \leq D/P,$$

wherein D is a distance in the second direction between two boundaries of the dummy area and wherein P is a pitch of the pixel defining openings of the second pixel defining block.

6. The display panel according to claim 3, wherein a number $N_p$ of the third pixel defining blocks is represented by the following equation:

$$N_p = N_f / ([N_2/\delta_N] + 1),$$

wherein the symbol [ ] denotes rounding down $N_2/\delta_N$, wherein $N_f$ denotes a number of the first pixel defining blocks, and wherein $N_2$ denotes the column number of the pixel defining openings of each second pixel defining block.

7. The display panel according to claim 1, wherein the display area and the peripheral area both have a non-rectangular shape, and wherein the display area and the peripheral area have an axisymmetric shape about the first direction.

8. The display panel according to claim 7, wherein each of the second pixel defining blocks comprises a first portion and a second portion as extensions of the respective first pixel defining block to the peripheral area on both sides of the respective first pixel defining block, respectively, and the column number of second pixel defining openings of each second pixel defining block is equal to a sum of a column number of pixel defining openings of the first portion and a column number of pixel defining openings of the second portion.

9. The display panel according to claim 1, further comprising a substrate; and a plurality of first electrodes disposed on a side of the pixel defining layer close to the substrate, wherein orthographic projections of the plurality of first electrodes on the substrate at least partially overlap orthographic projections of the plurality of pixel defining openings of the first pixel defining blocks on the substrate, respectively, and the orthographic projections of the plurality of first electrodes on the substrate are separated from orthographic projections of the plurality of pixel-defining openings of the plurality of second pixel-defining blocks on the substrate.

10. The display panel according to claim 1, wherein each first pixel defining block further comprises:

a plurality of first vertical pixel defining strips extending in the first direction and spaced apart in the second direction; and a plurality of first horizontal pixel defining strips extending in the second direction and spaced apart in the first direction, the pixel defining openings of the plurality of first pixel defining blocks is defined by the plurality of first vertical pixel defining strips and the plurality of first horizontal pixel defining strips, and each of the plurality of first vertical pixel defining strips having a thickness in a third direction perpendicular to the first direction and the second direction greater than a thickness of each of the plurality of first horizontal pixel defining strips in the third direction.

11. The display panel according to claim 1, wherein each second pixel defining block further comprises:

a plurality of second vertical pixel defining strips extending in the first direction and spaced apart in the second direction; and a plurality of second horizontal pixel defining strips extending in the second direction and spaced apart in the first direction, the pixel defining openings of the plurality of second pixel defining blocks defined by the plurality of second vertical pixel defining strips and the plurality of second horizontal pixel defining strips, and each of the plurality of second vertical pixel defining strips having a thickness in a third direction perpendicular to the first direction and the second direction greater than a thickness of each of the plurality of second horizontal pixel defining strips in the third direction.

12. The display panel according to claim 1, wherein each second pixel defining block further comprises:

a plurality of second vertical pixel defining strips extending in the first direction and spaced apart in the second direction, the pixel defining openings of each second pixel defining block in the same column connected to form a pixel defining channel defined by adjacent second vertical pixel defining strips.

13. The display panel according to claim 9, further comprising an initialization signal line disposed in the peripheral region, the initialization signal line comprising a body portion extending around a boundary between the peripheral area and the display area, and a plurality of protrusion portions protruding from the body portion toward the display area in a direction parallel to the second direction, an orthographic projection of at least one of the plurality of protrusion portions on the substrate being between the orthographic projections of the adjacent two rows of pixel defining openings of the second pixel defining block on the substrate, so that the individual protrusion portion provides signals for adjacent two rows of pixels defined by the adjacent two rows of pixel defining openings of the first pixel defining block extended by the second pixel defining block.

14. A method for preparing a display panel having a display area and a peripheral area at least partially encircling the display area, the method comprising:

providing a substrate, and forming a pixel defining layer on the substrate, the pixel defining layer comprising:

a plurality of first pixel defining blocks disposed in the display area and parallelly arranged in a first direction, each first pixel defining block extending in a second direction perpendicular to the first direction and comprising a plurality of columns of pixel defining openings with a column direction in the first direction, and adjacent first pixel defining blocks having different columns of pixel defining openings; and at least one second pixel defining block disposed in the peripheral area and serving as an extension of at least one of the plurality of first pixel defining blocks in the second direction to the peripheral area, each second pixel defining block comprising a plurality of columns of pixel defining openings, and having a column number of pixel defining openings greater than or equal to the difference in the column numbers of pixel defining openings of two adjacent first pixel defining blocks, wherein the extension of the at least one of the plurality of first pixel defining blocks by the at least one second pixel defining block allows the pixel defining layer to be reclassified to include at least one third pixel defining block, wherein each third pixel defining block is assigned at least two adjacent first pixel defining blocks and at least portions of the second pixel defining blocks as the extensions of the at least two adjacent first pixel defining blocks, and wherein each third pixel defining block has a column number of pixel defining openings equal to a sum of the column number of pixel defining openings of the one of the at least two adjacent first pixel defining blocks having the least columns of pixel defining openings and the column number of pixel defining openings of the second pixel defining block, wherein before forming the pixel defining layer, the method further comprises:

forming a plurality of first electrodes in the display area of the substrate, forming the pixel defining layer comprising:

forming the pixel defining layer on the plurality of first electrodes and in the peripheral area such that orthographic projections of the plurality of first electrodes on the substrate at least partially overlaps orthographic projections of the plurality of first pixel defining openings of the plurality of first pixel defining blocks on the substrate, respectively, and the orthographic projections of the plurality of first electrodes on the substrate are separated from orthographic projections of the plurality of pixel defining openings of the plurality of second pixel defining blocks on the substrate, after forming the pixel defining layer, the method further comprising:

forming a plurality of light-emitting units in the pixel defining openings of the at least one third pixel defining block to form a layer of light-emitting material, wherein in the case where there is a remaining pixel defining opening of the at least one second pixel defining block not assigned to a respective third pixel defining block, no light-emitting unit is formed in the remaining pixel defining opening of the at least one second pixel defining block.

15. A display device comprising a display panel according to claim 1 and a drive circuit configured to provide a drive signal for driving the display panel.

* * * * *